United States Patent [19]
Long et al.

[11] Patent Number: 5,969,083
[45] Date of Patent: Oct. 19, 1999

[54] LIQUID CRYSTALLINE POLYESTERS HAVING A SURPRISINGLY GOOD COMBINATION OF A LOW MELTING POINT, A HIGH HEAT DISTORTION TEMPERATURE, A LOW MELT VISCOSITY, AND A HIGH TENSILE ELONGATION

[75] Inventors: Timothy Edward Long, Kingsport, Tenn.; William Ronald Darnell, Weber City, Va.

[73] Assignee: Eastman Chemical Company, Kingsport, Tenn.

[21] Appl. No.: 09/212,530

[22] Filed: Dec. 16, 1998

Related U.S. Application Data

[60] Provisional application No. 60/101,032, Sep. 18, 1998.

[51] Int. Cl.$^6$ ........................................... C08G 63/00
[52] U.S. Cl. ...................... 528/194; 528/176; 528/190; 528/193
[58] Field of Search ................... 528/176, 190, 528/193, 194

[56] References Cited

U.S. PATENT DOCUMENTS

4,169,933 10/1979 Jackson, Jr. et al. .................. 528/190

*Primary Examiner*—Terressa Mosley
*Attorney, Agent, or Firm*—Betty J. Boshears; Harry J. Gwinnell

[57] ABSTRACT

Disclosed is a select class of liquid crystalline polyesters and molding compositions comprising the polyesters and glass fiber. The liquid crystalline polyesters consist essentially of (1) diacid residues consisting essentially of (i) cyclohexanedicarboxylic acid residues and (ii) other diacid residues selected from terephthalic acid residues, 2,6-naphthalenedicarboxylic acid residues, or a mixture thereof; (2) diol residues consisting essentially of hydroquinone residues, 4,4'-biphenol residues or a mixture thereof; and, optionally, (3) p-hydroxybenzoic acid residues. In the above definition, the moles of diol residues are equal to the moles of diacid residues and the total of the (1), (2) and (3) mole percentages is equal to 100. The liquid crystalline polyesters have melting points determined by differential scanning calorimetry equal to or less than 360° C.

27 Claims, 11 Drawing Sheets

Experimental Space for Determining the Melting Point (Tm) Of T-N(HQ)-(PHB) LCPs

NOTES:
(1) 'PHB' is the code for p-hydroxybenzoic acid.
(2) 100T/(T+N) is the mole % T, based only on T and N acids.

FIGURE 4

Contour Plot of Melting Point vs. Composition of T-N(HQ)-(PHB) LCPs Using Data From TABLE 1

(1) 'PHB' is the mole % of p-hydroxybenzoic acid; 100T/(T+N) is the mole % T, based only on T and N acids.

(2) The contour plot was obtained from the data in Table 1 using Design-Expert® software from STAT-EASE®, INC. The following is the model equation:

$$T_m = 514.39 - 6.33\frac{100T}{(T+N)} - 3.87(PHB) + 0.068\left[\frac{100T}{(T+N)}\right]^2 + 0.028(PHB)^2 + 0.039\left[\frac{100T}{(T+N)}\right][PHB]$$

$R^2 = 0.945$; $R^2$ (Adjusted) $= 0.911$ (3) The numbers positioned near the round black dots indicate the number of preps of that composition which were a part of the designed experiment.

FIGURE 5

Data Set for Developing a Model Equation for Melt Viscosity vs. Composition of T-N(HQ)-(PHB) LCPs (1) 'PHB' is the code for p-hydroxybenzoic acid; 100T/(T+N) is the mole % T acid, based only on T and N acids.

(2) The quadrilateral space depicted above shows the compositional space where the six compositions used to estimate LCP melt viscosities at IV = 7.0 and 345°C and 1 radian/second are located. (See TABLE 5.)

FIGURE 6

CONTOUR PLOT OF MELT VISCOSITY VS. COMPOSITION OF T-N(HQ)-(PHB) LCPs (MODEL DEVELOPMENT)

(1) 'PHB' is the mole % of p-hydroxybenzoic acid; 100T/(T+N) is the mole % of T acid, based on only T and N acids.

(2) The model was developed using the data in TABLE 5 and JMP® software from SAS Institute, Inc. In the figure, the contour lines are labeled at 500-poise intervals, and the melt viscosity values for the compositions from TABLE 5 are also labeled. The model obtained is as follows:

$$\mathrm{Melt\,Vis\cos ity}(Poise) = 6417.88 - 178.32\left[\frac{100T}{(T+N)}\right] - 156.11[PHB] + 6.17\left(\left[\frac{100T}{(T+N)}\right][PHB]\right)$$

$R^2 = 0.981$; $R^2$ (adjusted) = 0.953.

FIGURE 7

Data Set for Designed Experiment to Show Effect of Composition on Melt Viscosity, HDT, Tensile Strain, and Tm of T-N(HQ)-(PHB) LCPs
(HDT Data Shown)

(1) 'PHB' is the mole % of p-hydroxybenzoic acid; 100T/(T+N) is the mole % of T acid, based on only T and N acids.
(2) The HDT values for the compositions from TABLE 6 are labeled.

FIGURE 8

Contour Plot of Heat Distortion Temperature (264 Psi) vs. Composition of T-N(HQ)-(PHB) LCPs (30% Glass-Filled) using Data From TABLE 6 (Actual Data Points of Designed Experiment Shown)

(1) 'PHB' is the mole % of p-hydroxybenzoic acid; 100T/(T+N) is the mole % T, based only on T and N acids.

(2) The contour plot was obtained from the data in Table 6 using Design-Expert® software from STAT-EASE®, INC. The following is the model equation:

$$HDT = 43.61 + 4.07\left[\frac{100T}{(T+N)}\right] + 10.31[PHB] - 0.108[PHB]\left[\frac{100T}{(T+N)}\right] - 0.105[PHB]^2$$

$R^2 = 0.916$; $R^2$ (Adjusted) = 0.804

FIGURE 9

Contour Plot of Predicted Melt Viscosity, Poise, @ 345°C and 1 Radian/Second @ IV = 7.0 vs. Composition for T-N(HQ)-(PHB) LCPs Using Data from TABLE 6
(Actual Points of Designed Experiment Shown)

The equation shown below was used to prepare the above contour plot:

$$\mathrm{MeltVisc}\ (IV = 7.0) = 6417.88 - 178.32\left[\frac{100T}{(T+N)}\right] - 156.11[PHB] + 6.17\left(\left[\frac{100T}{(T+N)}\right][PHB]\right)$$

FIGURE 10

Contour Plot of Tensile Break Strain vs. Composition of T-N(HQ)-(PHB) LCPs
(30Wt % Glass-Filled) Using Data From TABLE 6
(Actual Data Points of Designed Experiment Shown)

(1) 'PHB' is the mole % of p-hydroxybenzoic acid; 100T/(T+N) is the mole % T, based only on T and N acids.
(2) The contour plot was obtained from the data in Table 6 using Design-Expert® software from STAT-EASE®, INC. The following is the model equation:

$$TensileBrk(\%) = 0.1580 + 0.0133 \left[ \frac{100T}{(T+N)} \right] + 0.1220[PHB] - 0.00066[PHB]\left[ \frac{100T}{(T+N)} \right] - 0.00184[PHB]^2$$

$R^2 = 0.962$; Adjusted $R^2 = 0.911$

FIGURE 11

Overlay of Contour Plots Showing the Compositional Area of T-N(HQ)-(PHB) LCPs where HDT is ≥ 265°C, Predicted Melt Viscosity is ≤ 2500 Poise, and Tensile Break Strains are ≥ 1.4 % (a), (b), (c), (d)

(a) 'PHB' is the mole % of p-hydroxybenzoic acid; 100T/(T+N) is the mole % T, based only on T and N acids.
(b) The contour plots were obtained from the data in Table 6 using Design-Expert® software from STAT-EASE®, INC. This overlay contour plot is a composite of Figures 9, 10, and 11.
(c) Melt viscosities are predicted at 345°C @ 1 radian/second @ IV = 7.0 using the model shown in FIGURE 9.
(d) HDT and tensile break strain values were measured on 30% glass-filled compositions.

LIQUID CRYSTALLINE POLYESTERS HAVING A SURPRISINGLY GOOD COMBINATION OF A LOW MELTING POINT, A HIGH HEAT DISTORTION TEMPERATURE, A LOW MELT VISCOSITY, AND A HIGH TENSILE ELONGATION

REFERENCE TO RELATED APPLICATION

This application claims the benefit of U.S. Provisional Application Ser. No. 60/101,032 filed on Sep. 18, 1998.

FIELD OF THE INVENTION

This invention pertains to certain aromatic liquid crystalline polyesters (LCPs) derived from terephthalic acid (T), 2,6-naphthalenedicarboxylic acid (N), hydroquinone (HQ), and p-hydroxybenzoic acid (PHB) which exhibit a surprising combination of a relatively low melting point, a relatively low melt viscosity at typical processing temperatures, a relatively high tensile elongation (strains) at break, and a relatively high heat distortion temperature.

BACKGROUND OF THE INVENTION

Low-melt viscosity, polymeric materials are generally preferred over higher melt viscosity materials because of their better processability during injection molding, melt extrusion, etc. This is particularly true for polymeric materials having relatively high melting points (Tm's), i.e., more than about 300° C. Advantages realized by the use of such lower melt viscosity polymeric materials include (1) less energy consumption, (2) fewer safety and handling hazards, (3) less polymer degradation problems during processing, (4) faster mold filling in constrained geometries, (5) improved compounding with fillers, such as glass, talc, etc., and (6) greater ease to stir/pump/manufacture the material.

Essentially all thermoplastic resins are required to undergo flow in the molten state during the course of manufacture and fabrication into products. Thus, such important processing operations as extrusion, molding, calendering, etc., all involve the flow of molten, or relatively fluid, polymer. In such systems, the crystalline regions undergo melting in a fixed temperature range, and the polymer, above the melting temperature, behaves as a fluid rather than as a solid. As described herein, the melt viscosity of thermoplastic polymer systems is a measure of the flow characteristics of the material in the fluid or molten state under certain temperature and shear conditions. For liquid crystalline polymer systems above the temperature at which they become molten, a certain amount of order remains in the molten material which can lead to improved processing characteristics, especially low melt viscosity at high shear rates, such as during extrusion or injection molding. The melt viscosity of a thermoplastic polymer is affected by many variables, among which are such variables as temperature, rate of flow, polymer molecular weight, molecular weight distribution, branching, and chemical structure. It is generally agreed that lower melt viscosities are a distinct advantage during processing (extrusion, injection molding, etc.) of thermoplastic materials.

Another very important property of injection-molded polymeric materials is the tensile elongation (strain) at break. This is especially true for glass-filled, injection-molded liquid-crystalline polyesters that have at best relatively low tensile elongations (usually 2% or less). Since tensile strength and tensile elongation at break are very closely related to 'toughness' of an injection-molded material and high 'toughness' is highly desirable, it is very desirable to have the highest tensile elongation (strain) possible.

In addition to low melt viscosity and high tensile elongation, a relatively low polymer melting point is a very desirable property for thermoplastic materials, especially when the polymer melting point is greater than 300° C. Lower melting points lead to lower processing temperatures that lead to better processability and less polymer degradation during processing.

Another desirable property for injection-molded, glass-filled LCP materials is a high heat distortion temperature, e.g., 265° C. or higher. This is especially true for glass-filled, injection-molded liquid crystalline materials that are most often used in applications requiring resistance to very high temperatures, such as in circuit boards and electrical connectors that are often 'soldered' by immersing in a molten solder bath.

Liquid crystalline polyesters (LCPs) are unique among polymers because they have very high tensile, flexural, and temperature resistance properties which are very desirable properties for high performance applications, such as in structural applications and in electronic applications. U.S. Pat. No. 4,169,933 discloses a group of liquid crystalline polyesters which consist essentially of residues of terephthalic acid, 2,6-naphthalenedicarboxylic acid, hydroquinone, and p-hydroxybenzoic acid.

There is a need in the art for LCPs to exhibit a very desirable and surprising combination of a relatively low melting point, a relatively low melt viscosity, a relatively high tensile elongation (strain) at break, and a relatively high heat distortion temperature. Properties that facilitate the injection molding of tougher, more heat resistant, intricate and thin cross-sectional designs, such as electrical connectors, used in computers and other electrical components are desirable. In fact, some of these intricate and thin cross-sectional designs are very difficult or impossible to injection mold using non-liquid crystalline polymers. This is especially true for mold designs containing numerous very small, thin-walled cavities and/or those mold designs that require the polymer to flow through relatively thin cross sections over a considerable distance. Therefore, LCP compositions that enable the molding of such relatively tough, complex/intricate designs are very useful.

It is, therefore, an object of this invention to provide a range of LCP compositions derived from terephthalic acid (T), 2,6-naphthalenedicarboxylic acid (N), hydroquinone (HQ), and p-hydroxybenzoic acid (PHB) that exhibit a very desirable combination of properties, i.e., a relatively low melt viscosity at typical processing temperatures, a relatively low melting point, and a relatively high tensile elongation (strain) and heat distortion temperature, when compounded with 30 glass fibers and injection molded.

SUMMARY OF THE INVENTION

This invention relates to a liquid crystalline polyester derived from:
  (1) diacid residues consisting essentially of:
    (a) about 3.8 to 20 mole percent terephthalic acid (T) residues, and
    (b) about 15 to 31 mole percent 2,6-naphthalenedicarboxylic acid(N); and
  (2) diol residues consisting essentially of:
    (c) about 25 to 40 mole percent hydroquinone (HQ) residues; and
    (d) about 20 to 51 mole percent p-hydroxybenzoic acid (PHB) residues, wherein the T/T+N molar ratio is from about 15:85 and 50:50, the moles of HQ are equal to the sum of the moles of T+N, and the total of the (a), (b), (c), and (d) mole percentages is equal to 100, and the liquid crystalline polyester has a melting point determined by differential scanning calorimetry equal to or less than 360° C.

The LCPs of the invention exhibit the very desirable and surprising combination of a relatively low melting point, a relatively low melt viscosity at typical processing temperatures, a relatively high tensile elongation (strains) at break, and a relatively high heat distortion temperature.

DESCRIPTION OF THE INVENTION

More particularly, the diacid residues consist of about 3.8 to 20 mole percent terephthalic acid (T) residues, preferably about 6.9 to 20 mole percent and more preferably 9 to 16 mole percent; and about 15 to 31 mole percent 2,6-naphthalenedicarboxylic acid (N), preferably about 15 to 30 mole percent and more preferably, and about 18 to 28 mole percent. The diol residues consist of about 25 to 40 mole percent hydroquinone (HQ) residues; preferably about 27.5 to 40 mole percent and more preferably about 30 to 40 mole percent; and 20 to 51 mole percent p-hydroxybenzoic acid (PHB) residues, preferably about 20 to 45 mole percent and more preferably about 20 to 40 mole percent.

It is particularly preferred that the T/T+N molar ratio is from about 15:85 to 50:50.

In the liquid crystalline polyester of the invention, the moles of HQ are equal to the sum of the moles of T+N, and the total of the (a), (b), (c), and (d) mole percentages is equal to 100.

It is preferred that the liquid crystalline polyester has a melting point determined by differential scanning calorimetry equal to or less than 360° C. It is also preferred that the liquid crystalline polyester has a tensile elongation at break of $\geq 1.8\%$, preferably 1.4%, as determined by ASTM Test Method D638 with extensometer. It is further preferred that the liquid crystalline polyester have a melt viscosity at 345° C. and 1 radian/second of $\leq 2500$ poise at an inherent viscosity equaling 3.0 to 11.0, preferably 5.0 to 10.0 dL/g, measured at 25° C. in 60:40 by weight pentafluorophenol/1,2,4-trichlorobenzene at 0.1 g/100 mL in a Schott Gerate viscometer. It is even further preferred that the liquid crystalline polyester has a heat distortion temperature at 264 psi of about $\geq 265°$ C.

In a preferred embodiment, it is preferred that the liquid crystalline polyester has the following properties in combination: a tensile elongation at break of $\geq 1.8\%$, preferably 1.4%; a melt viscosity at 345° C. and 1 radian/second of $\leq 2500$ poise at an inherent viscosity equaling 3.0 to 11.0, preferably 5.0 to 10.0 dL/g; and a heat distortion temperature at 264 psi of $\geq 265°$ C.

The compositions of the invention may have a wide range of molecular weights as measured by inherent viscosity (IV). IV's may vary over a wide range up to 10 dL/g or more, but lower IV's are preferred because of the more desirable processability. Suitable IV's for high performance applications such as in circuit boards and injection-molded applications range from about 4.0 to about 8.0 dL/g.

The above LCP compositions of the invention may be prepared by the procedures well-known to those skilled in the art, such as by heating the terephthalic acid (T), 2,6-naphthalenedicarboxylic acid (N), and the acyl derivatives of hydroquinone (HQ) and p-hydroxybenzoic acid (PHB) with or without a catalyst to form the LCP and a volatile carboxylic acid. Alternatively, the compositions may be prepared by heating the terephthalic acid (T), 2,6-naphthalenedicarboxylic acid (N), hydroquinone (HQ), and p-hydroxybenzoic acid (PHB) in a reactor with an aliphatic acid anhydride, such as acetic or propionic anhydride, with or without a catalyst, to first carry out the acylation of the hydroxy groups and then effect the polycondensation reaction as before described. For those skilled in the art, a useful variation of this alternative method is the separate acylation of the hydroxy-containing monomers in a first reactor, transferring this product to a second reactor, adding the dicarboxylic acids, and carrying out the polycondensation reaction as before described. Also, the compositions of the invention may be prepared to relatively low molecular weight by one of the previously described methods to form a prepolymer which can be further polymerized to high molecular weight by solid-state polymerization techniques well known to those skilled in the art. Also, a prepolymer of the compositions of the invention may be prepared with or without a catalyst in an extruder and further polymerized to high molecular weight by solid-state polymerization techniques well known to those skilled in the art. A prepolymer is defined herein as the forming polymer during polymerization that has attained an inherent viscosity of about 0.3 to 3.0 dL/g measured at 25 C in 60:40 by weight pentafluorophenol at 0.1 g/100 mL in a Schoft Gerate viscometer.

Suitable catalysts include dialkyl metal oxide (preferably dialkyl tin oxide), diaryl metal oxide (preferably diaryl tin oxide), titanium dioxide, alkoxy titanium silicates, titanium alkoxides, alkali metal and alkaline earth metal salts of carboxylic acids, gaseous acid catalysts such as Lewis acids (e.g., $BF_3$), hydrogen halides (e.g., HCL), and the like. The quantity of catalyst utilized is typically about 50 to about 500 parts per million, based on the total weight of starting materials (less the acyl anhydride, if any). If a multi-step reaction process is used as before described, the catalyst may be added to the acylation or polycondensation steps. For purposes of this invention, the use of about 100 to about 300 parts per million by weight of at least one alkali metal-containing catalyst is preferred.

The LCP compositions of the invention are useful for a variety of end uses requiring a combination of very good tensile, flexural, flammability, and thermal resistance properties in combination with excellent processability. When filled with glass fibers, they are particularly useful for electronic applications. When filled with 30% glass fibers, the compositions of the invention are excellent materials for use in electronic applications such as thin, intricately designed, injection-molded circuit boards and electrical connectors that will withstand soldering conditions.

The above-described LCP compositions may be molded into thin parts by a variety of means including compression and injection molding. A particular end use where such thin molded articles or parts are required is in electrical connectors and circuit boards for electrical/electronic applications. These LCPs are particularly useful for molding intricately-designed articles containing thin sections (1.5-mm or less), such as are commonly used in electrical connectors and other electrical/electronic applications. Due to the intricate designs involving very thin insulating walls around numerous metal pins and the long paths through which the molten polymer is required to flow during molding in some mold designs, many electrical connectors are impossible to mold using non-liquid crystalline polymers.

Low-melt viscosity, polymeric materials are generally preferred over higher melt viscosity materials because of their better processability during injection molding, melt extrusion, etc. This is particularly true for polymeric materials having relatively high melting points (Tm's), i.e., more than about 300° C. Advantages realized by the use of such lower melt viscosity polymeric materials include (1) less energy consumption, (2) fewer safety and handling hazards, (3) less polymer degradation problems during processing, (4) faster mold filling in constrained geometries, (5) improved compounding with fillers, such as glass, talc, etc., and (6) greater ease to stir/pump/manufacture the material.

Another very important property of injection-molded polymeric materials is the tensile elongation (strain) at break, particularly for glass-filled, injection-molded liquid-crystalline polyesters that have at best relatively low tensile elongation (usually 2% or less). Since tensile strength and tensile elongation at break are very closely related to 'toughness' of an injection-molded material and high 'toughness' is highly desirable, it is very desirable to have the highest tensile elongation (strain) possible. The compositions of this invention have tensile strains at break of $\geq 1.8\%$, preferably 1.4% (extensiometer used during the tensile test) using ASTM Method D638.

In addition to a low melt viscosity and a high tensile break strain (elongation), a relatively low polymer melting point is a very desirable property for thermoplastic materials, especially when the polymer melting point is greater than 300° C. Lower melting points lead to lower processing temperatures that lead to better processability and less polymer degradation during processing.

Another very desirable property for injection-molded, glass-filled LCP materials is a high heat distortion temperature. This is apparent for glass-filled, injection-molded liquid crystalline materials that are most often used in applications requiring resistance to very high temperatures, such as in circuit boards and electrical connectors that are often 'soldered' by immersion in a molten solder bath. As previously mentioned, the compositions of this invention have heat distortion temperatures at 264 psi of $\geq 265°$ C.

The LCP compositions of the invention may contain various additives and/or various fillers. The fillers may be in fibrous, particulate, or flaky form, depending on the intended use of the material. Preferred additives include antioxidants, titanium dioxide, carbon black, clay, flame retardants, drip suppressants and other pigments.

Examples of fibrous fillers include inorganic fibrous materials such as glass fiber, silica fiber, silica/alumina fiber, alumina fiber, zirconia fiber, boron nitride fiber, silicon nitride fiber, boron fiber, potassium titanate fiber, and fibrous materials of metals such as stainless steel, aluminum, titanium, copper, and brass. Glass fiber is especially useful as a fibrous filler. It is also possible to use high-melting organic fibrous materials such as polyamide, polyester, or acrylic resin.

Examples of particulate fillers include carbon black, graphite, silica, quartz powder, glass beads, milled glass fiber, glass balloons, glass powder, silicates such as calcium silicate, aluminum silicate, kaolin, talc, clay (such Montmorillonite clay), diatomaceous earth, and wollastonite, metallic oxides such as iron oxide, titanium oxide, zinc oxide, antimony trioxide, and alumina, metal carbonates such as calcium carbonate and magnesium carbonate, metal sulfates such as calcium sulfate and barium sulfate, and various other powdery materials such as ferrite, silicon carbide, silicon nitride, and boron nitride.

Examples of flaky inorganic materials include mica, glass flake, and various metallic foils.

Examples of organic fillers include heat-resistant, high strength synthetic fibers such as an organic polyester fiber, liquid crystal polymer fiber, aromatic polyamide fiber, and polyimide fiber.

The organic and inorganic fillers may be used alone or in combination of two or more at levels up to 60 weight percent or more, and these additives may be compounded with the LCP compositions of the invention by methods well known to those skilled in the art, such a by extrusion of a physical mixture of the materials in an extruder. Also, certain of the additives, such as antioxidants or carbon black, may advantageously be added to the LCPs during polymerization.

Another preferred embodiment of the invention is a molding composition comprising a blend of any of the liquid crystalline polyester compositions described herein; and at least 20 weight percent glass fibers based on the total weight of the molding composition.

It is preferred that the molding composition contain glass fibers in the amount of about 30 weight percent based on the total weight of the molding composition.

It is also preferred that the glass fiber has a thickness of about 9 to 15 microns and a length of about 0.8 to 26 mm. It is further preferred that the molded article has a thickness of less than about 1.5 mm.

In FIGS. 3 through 12, the % PHB values were plotted against the 100T/(T+N) values for the compositions in Tables 1, 5, or 6. It is important to note that 100T/(T+N) only involves the relative values for mole % T, which is referred to as T*, and mole % N, which we refer to as N*, in the final polymeric composition, rather than the absolute values for mole % T and mole % N in the final polymeric composition. (In other words, this equation gives T*, the mole % T based only on the moles of T+N). Therefore, T*+N*=100 mole %, based on T and N acids only. Reading the % PHB and 100T/(T+N) values from the contour plots and calculating the composition using the following equations will give the composition of any point selected on these contour plots. See below:

(i) For polymeric compositions:
(a) T+N+HQ+PHB=100 mole %.
(b) T+N=HQ
(c) 100−PHB=T+N+HQ=2(T+N)=2(HQ)

$$\frac{100T}{(T+N)} = T^* \text{(mole \% } T, \text{ based on } T+N \text{ acids only)}. \quad \text{(ii)}$$

$$T^* + N^* = 100; \text{ or} \quad \text{(iii)}$$

$$100 - T^* = N^* \text{(mole \% } N, \text{ based on } T+N \text{ acids only)}.$$

$$\frac{T^*}{N^*} = \frac{T}{N} = \text{molar ratio of } T \text{ and} \quad \text{(iv)}$$

$N$ acids in the polymeric composition.

Figure 3:
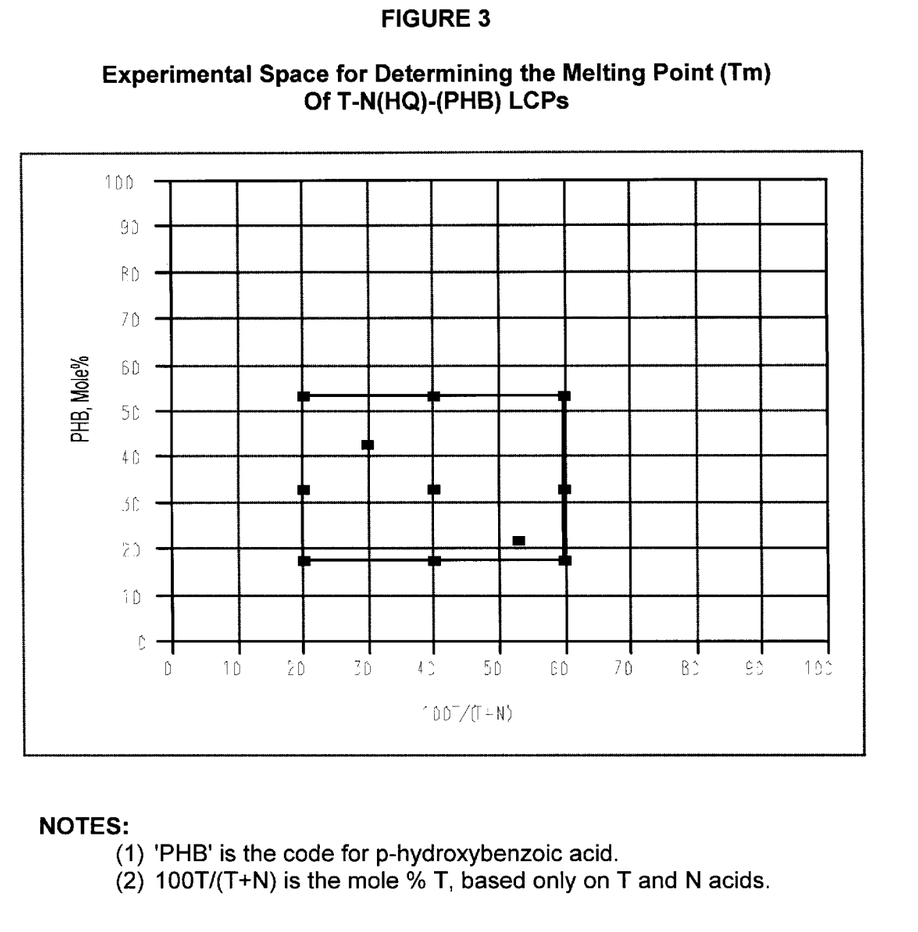
FIG. 3- Graphical representation demonstrating the determinaton of melting points of certain LCPs.

For example, in FIG. 3, the center-most point of the points displayed has a % PHB value of about 33 and a $$\frac{100T}{(T+N)}$$

value of about 40. Therefore from Equations (ii), (iii), and (iv), T*=40;
N*=60;

$$\frac{T^*}{N^*} = \frac{T}{N} = \frac{40}{60} = 0.67;$$

and T=0.67N (in polymer). From Equations (ia), (ib) and (ic):

$T+N+HQ+PHB=100;$ or $[T+N+(T+N)+PHB=100];$ or b $2(T+N)=100-PHB$

Substituting 0.67N=T and the PHB value (33), read from the contour plot, into the above expression, one obtains the following:

$$N(\text{in polymer}) = \frac{67}{3.34} = 20.$$

From T=0.67N (in polymer), the T (in polymer) is 13.4.
From these values and Equation (ib), one obtains the mole % HQ as follows:

$T+N=HQ$ (in polymer);

or, 13.4+20=33.4=mole % HQ (in polymer)

From this value, the earlier calculated values for T and N (in polymer), and Equation (ia), the composition of the center-most point of the points displayed in the contour plot shown in FIG. 3 is 13.4T−20N−33.4(HQ)−33.2 (PHB).

The compositions of the invention exhibit a very desirable and surprisingly good combination of a relatively low melting points, a high heat distortion temperature, a high tensile elongation at break, and a low melt viscosity. The excellent combination of properties is exhibited by the compositions of the invention and is exemplified by the following experimental data and as represented in the series of tables and figures shown in the TABLES AND FIGURES section.

Figure 1:
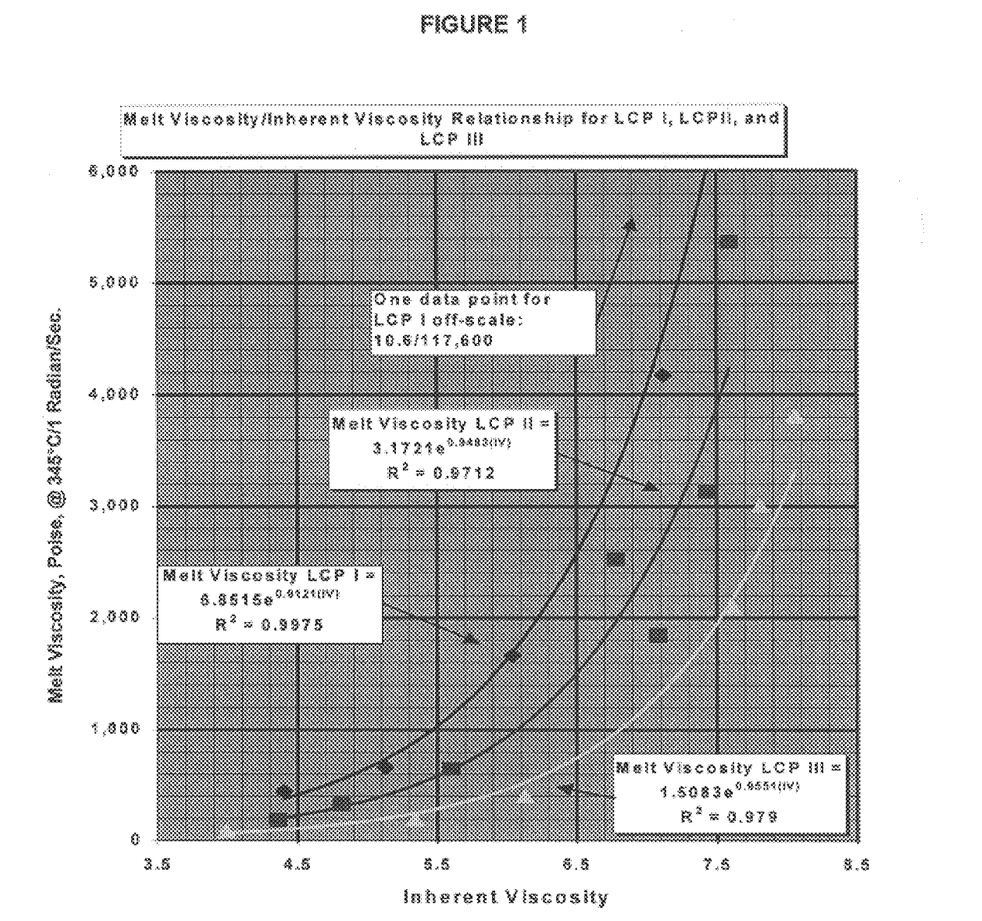
FIG. 1- Graphical representation demonstrating the melt viscosity/inherent viscosity relationship for certain LCPs.
Figure 2:
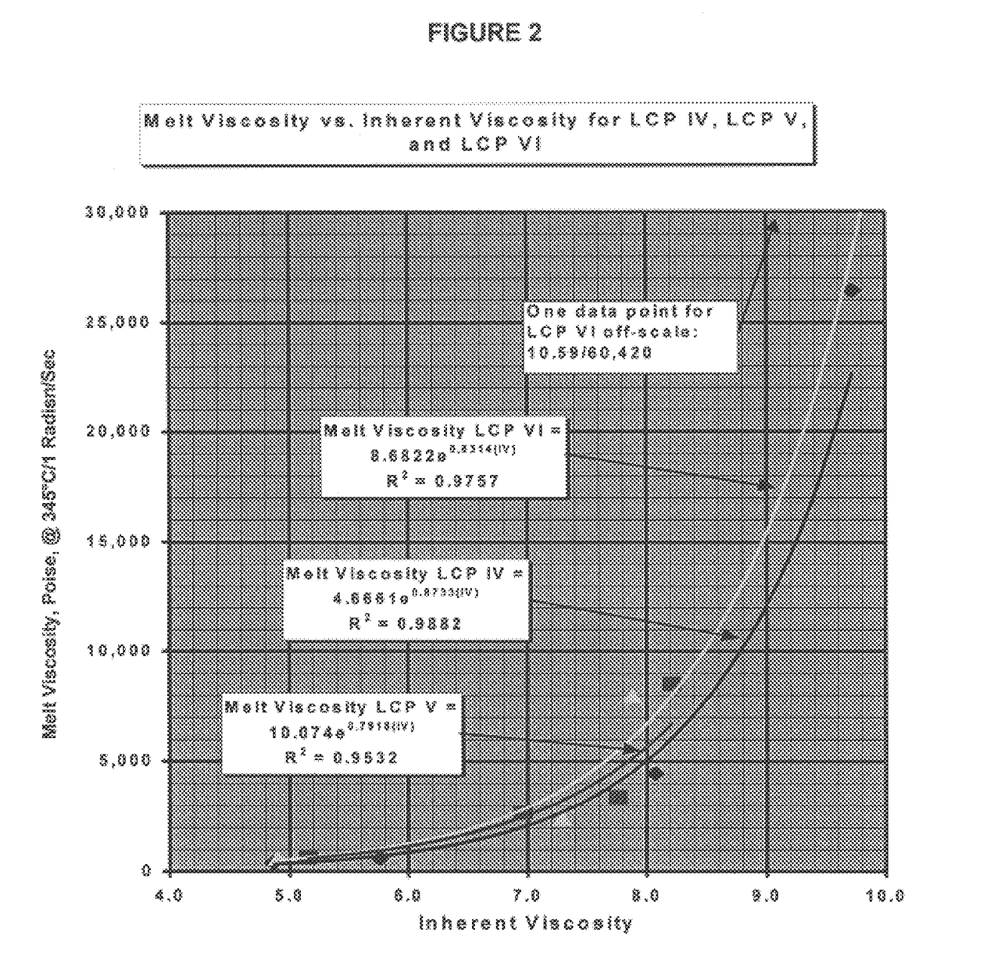
FIG. 2- Graphical representation demonstrating the melt viscosity/inherent viscosity relationship for certain LCPs.
Figure 4:
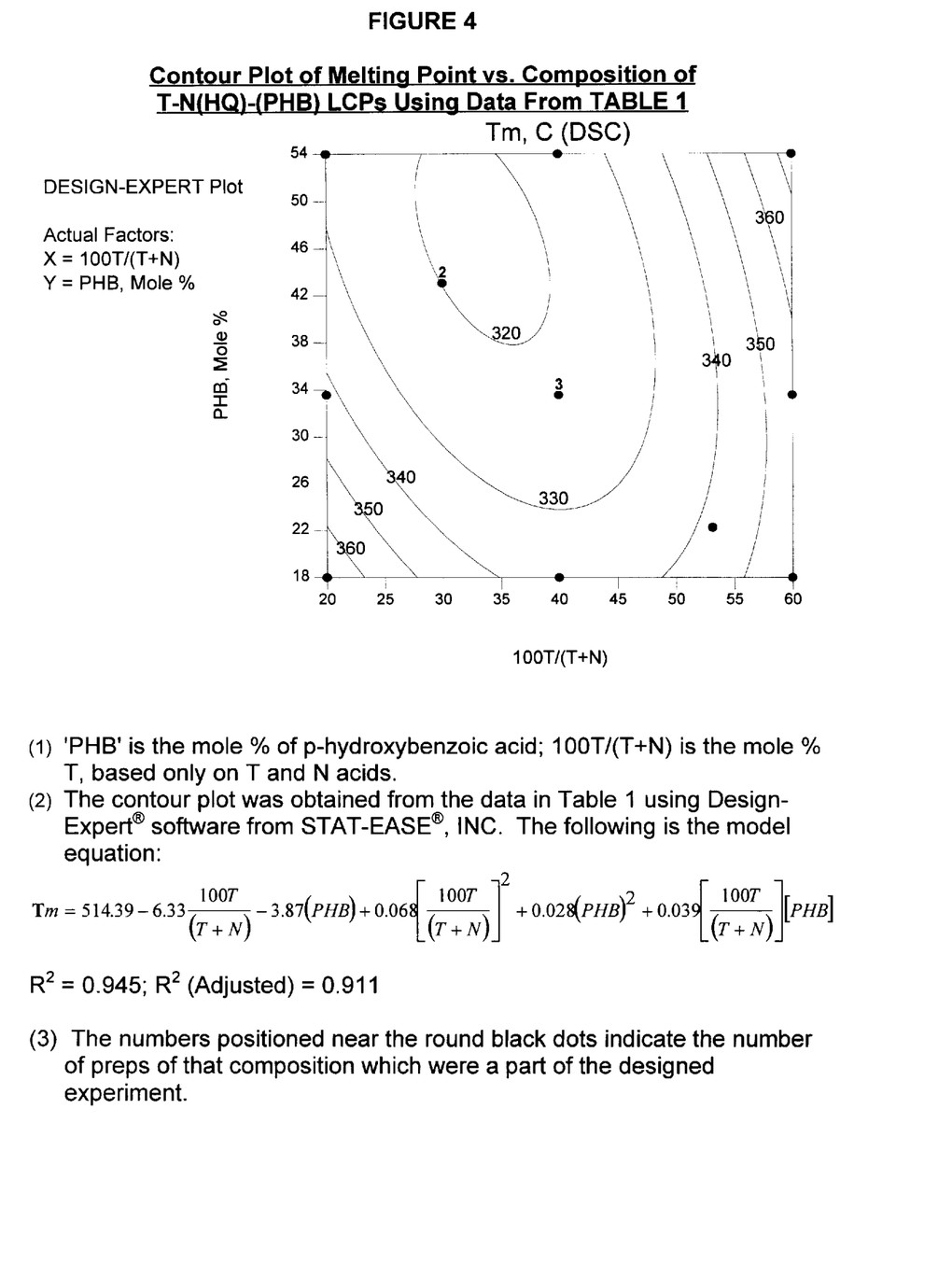
FIG. 4- Graphical representation demonstrating a plot of melting point vs. polymer composition.
Figure 5:
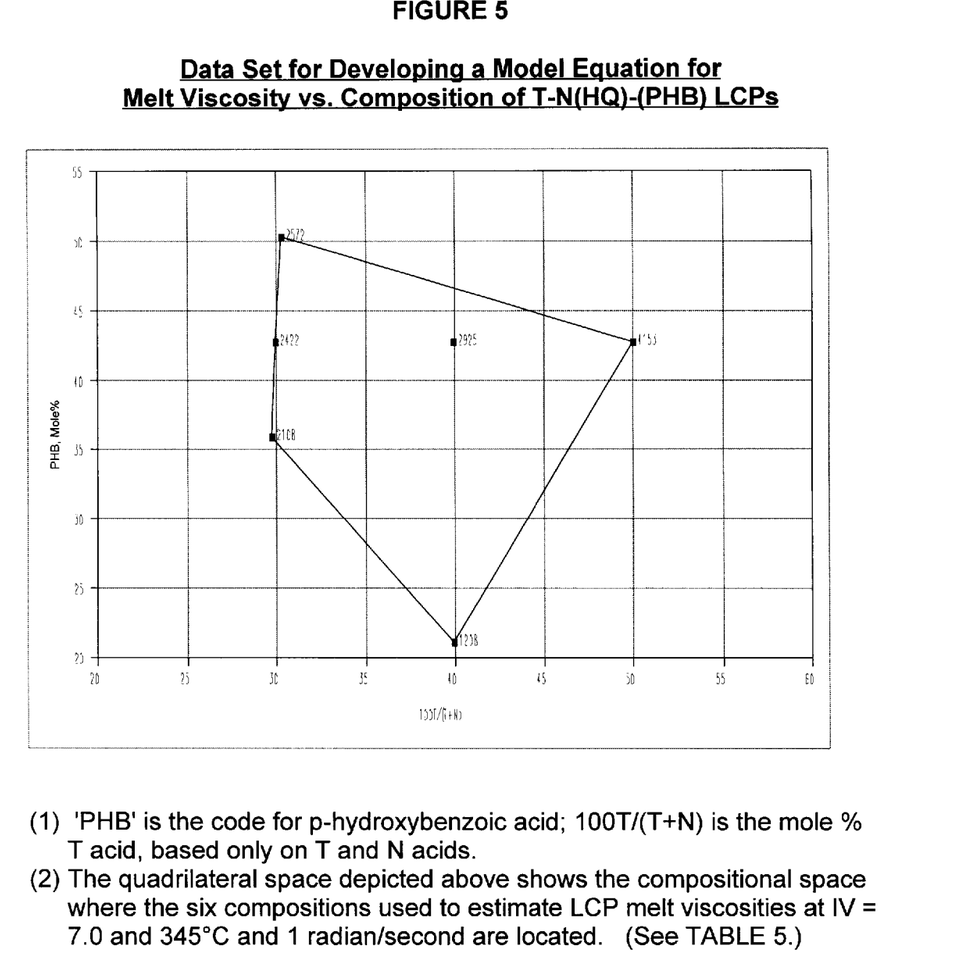
FIG. 5- Graphical representation of a data set for developing a model equation for melt viscosity vs. composition of T-N(HQ)-(PHB) LCPs.
Figure 6:
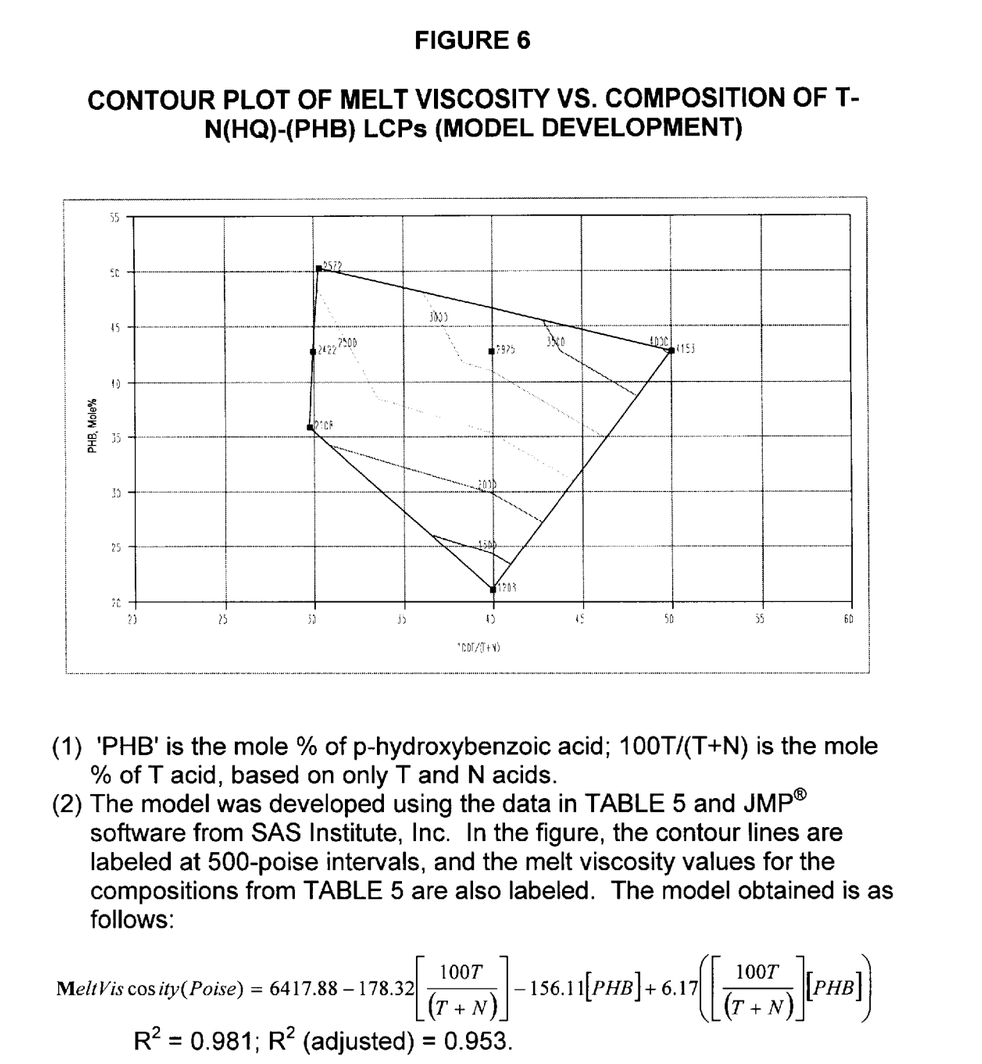
FIG. 6- Graphical representation of a plot of melt viscosity vs. composition of T-N(HQ)-(PHB) LCPs.

First, a series of compositions was prepared (lab-scale) as described in Example 1 and as specified in TABLE 1 and FIG. 3, and the DSC melting points were determined. From these data, a model equation was obtained and a contour plot of melting point vs. polymer composition was prepared as shown in FIG. 4. From this contour plot, a compositional range was chosen where the DSC melting points were ≦360° C., and a range of IV's (from about 4.0 to 10) for each of six LCP compositions (LCP I through LCP VI) was prepared as described in Example 1 to develop a model equation describing melt viscosity vs. LCP composition. These LCP compositions are given in TABLES 2 and 3. To develop such a model equation, the melt viscosity for the various compositions must be known at the same IV. Therefore, to obtain good estimates for the melt viscosity of the six compositions at 345° C. and 1 radian/second at IV=7.0, the data in TABLES 2 and 3 were plotted as shown in FIGS. 1 and 2, and a 'best-fit' exponential equation was fit to the data using Microsoft EXCEL software. These 'best-fit' exponential equations are given in TABLE 4. The melt viscosities at 345° C. and 1 radian/second at IV=7.0 for the six compositions were determined by substituting 'IV=7.0' into the TABLE 4 equations and calculating the corresponding melt viscosity. These calculated melt viscosity data for LCP I through LCP VI at 345° C. and 1 radian/second at IV=7:0 are given in TABLE 5. FIG. 5 shows graphically this TABLE 5 data set which was then used to develop the contour plot shown in FIG. 6. The equation describing the relationship of LCP composition and the melt viscosity at 345° C. and 1 radian/second at IV=7.0 is also given in FIG. 6. This equation is used later to predict the melt viscosity of other LCP compositions at 345° C. and 1 radian/second at IV=7.0.

Now, we have equations relating LCP composition to (1) LCP melting point:

$$Tm = 514.39 - 6.33100\frac{T}{(T+N)} - 3.87(PHB) +$$

$$0.068\left[\frac{100T}{(T+N)}\right]^2 + 0.028(PHB)^2 + 0.039\left[\frac{100T}{(T+N)}\right][PHB]$$

EQUATION A and (2) melt viscosity at 345° C. and 1 radian/second at IV=7.0:

Melt Viscosity(Poise) =

$$6417.88 - 178.32\left[\frac{100T}{(T+N)}\right] - 156.11[PHB] + 6.17\left\{\left[\frac{100T}{(T+N)}\right][PHB]\right\}$$

EQUATION B

Figure 7:
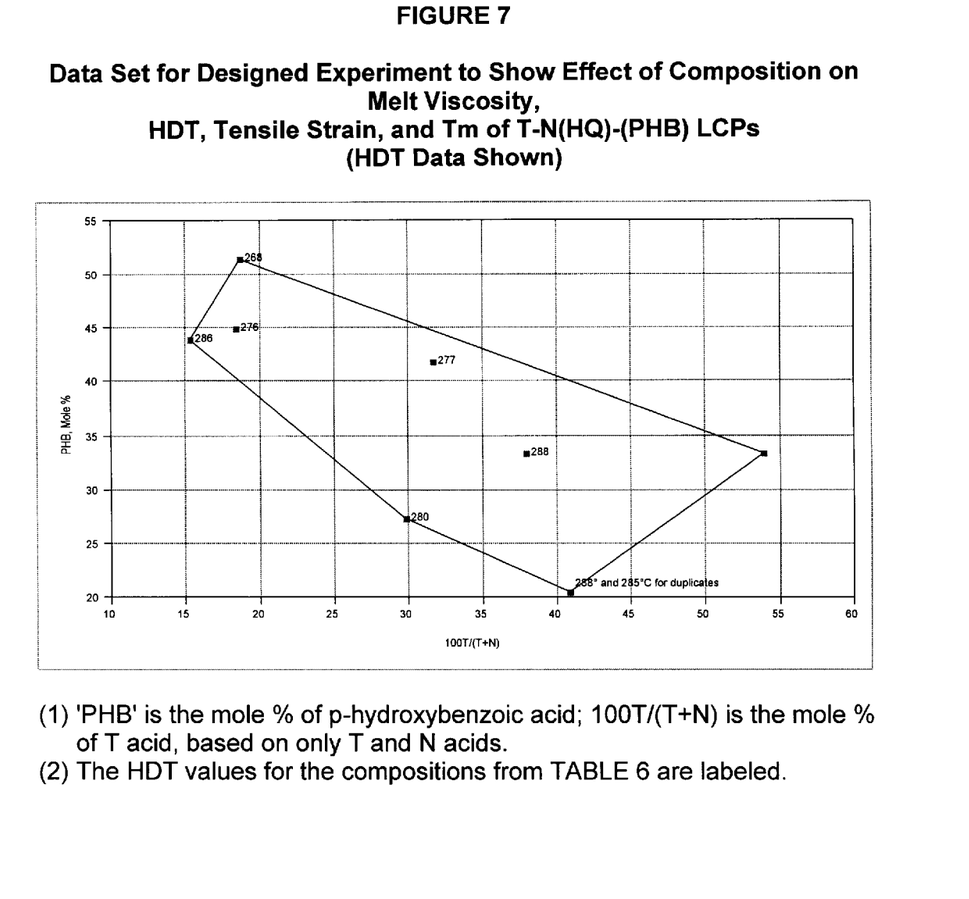
FIG. 7- Graphical representation of a data set for a designed experiment to show the effect of composition on physical properties of certain LCPs.

To relate LCP composition to injection-molded properties, a series of large-scale (25 to 30-lb) batches of various LCP compositions having relatively low melt viscosity and relatively low melting points (selected from FIGS. 4 and 6) was prepared as described in Example 2, compounded with 30 wt % glass fiber, and injection molded into standard ⅛-in tensile and flexural bars. These compositions with their corresponding heat distortion temperature (HDT), tensile strain at break, and predicted melt viscosity at 345° C. and 1 radian/second at IV=7.0 data are shown in TABLE 6. FIG. 7 shows the data set with the corresponding HDT values.

Figure 8:
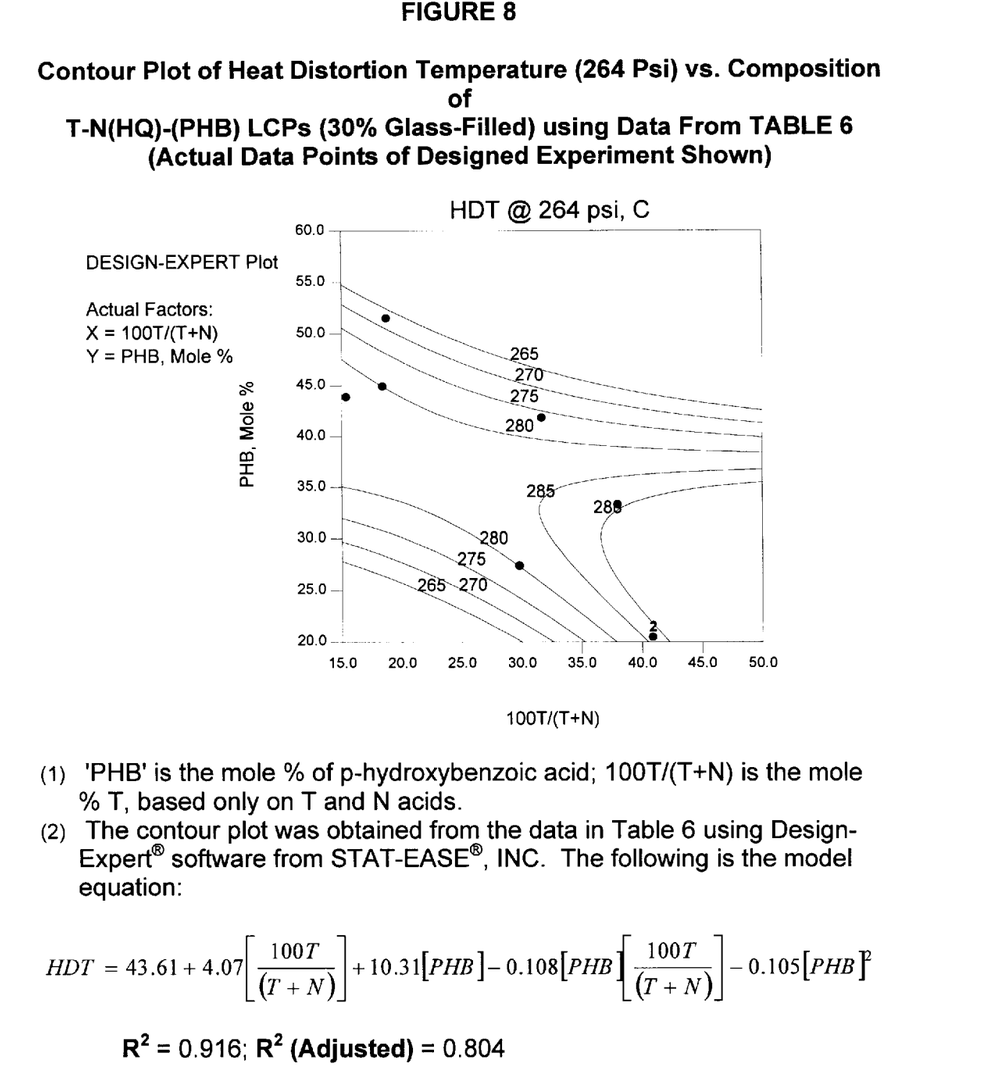
FIG. 8- Graphical representation of a plot of heat distortion temperature (264 psi) vs. composition of certain glass-filled LCPs using data from Table 6.

Using DESIGN-EXPERT software from STAT-EASE, INC., contour plots showing the relationship of LCP composition to HDT (FIG. 8), LCP composition to melt viscosity at 345° C. and 1 radian/second at IV=7.0 (FIG. 9), and LCP composition to tensile break strain (FIG. 10) were developed using the data in TABLE 6. The equations for the various contour plots are as follows:

$$\text{HDT} = 43.61 + 4.07 \left[ \frac{100T}{(T+N)} \right] \times 10.31[PHB] =$$
$$0.108[PHB]\left[\frac{100T}{(T+N)}\right] - 0.105[PHB]^2$$

Figure 9:
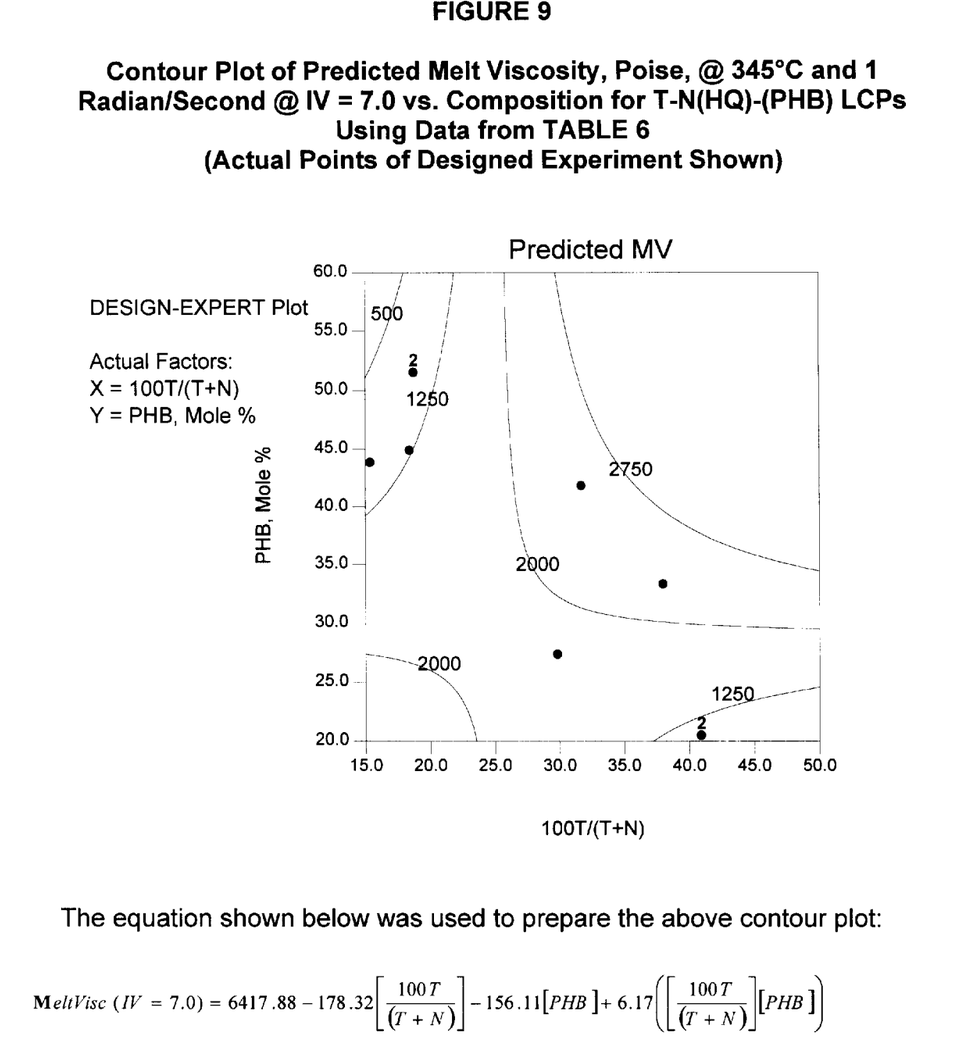
FIG. 9- Graphical representation of a plot of predicted melt viscosity, poise, @345° C. and 1 radian/second @IV= 7.0 vs. composition for T-N(HQ)-(PHB) LCPs using data from Table 6.

{HDT: EQUATION C}

$$\text{Melt Viscosity(Poise)} = 6417.88 -$$
$$178.32\left[\frac{100T}{(T+N)}\right] - 156.11[PHB] + 6.17\left\{\left[\frac{100T}{(T+N)}\right][PHB]\right\}$$

Figure 10:
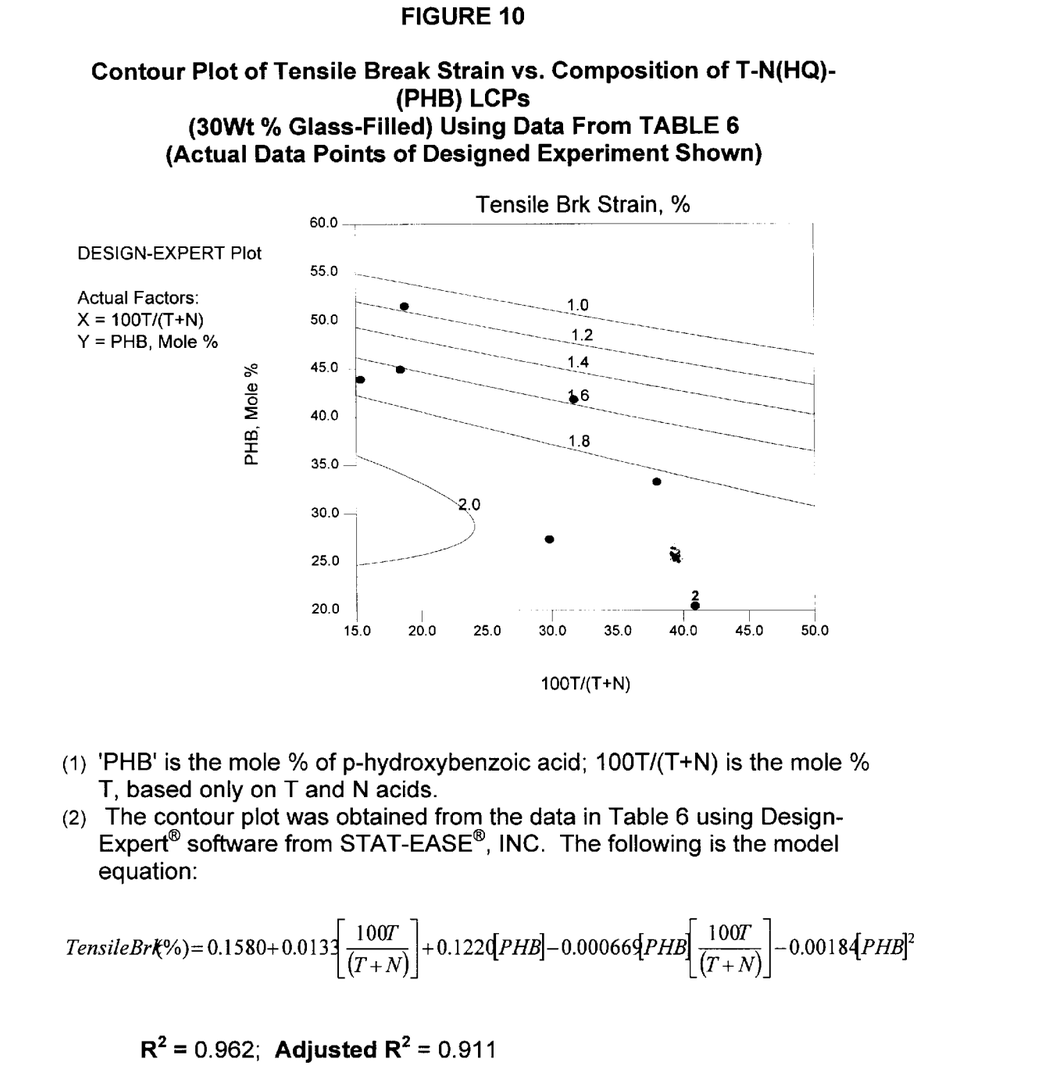
FIG. 10- Graphical representation of a plot of tensile break strain vs. composition of glass-filled T-N(HQ)-(PHB) LCPs using data from Table 6.

{Melt Viscosity: EQUATION D}

$$\text{Tensile Brk(\%)} = 0.1580 + 0.0133\left[\frac{100T}{(T+N)}\right] + 0.1220[PHB] -$$
$$0.000669[PHB]\left[\frac{100T}{(T+N)}\right] - 0.00184[PHB]^2$$

{Tensile Break Strain: EQUATION E}

Figure 11:
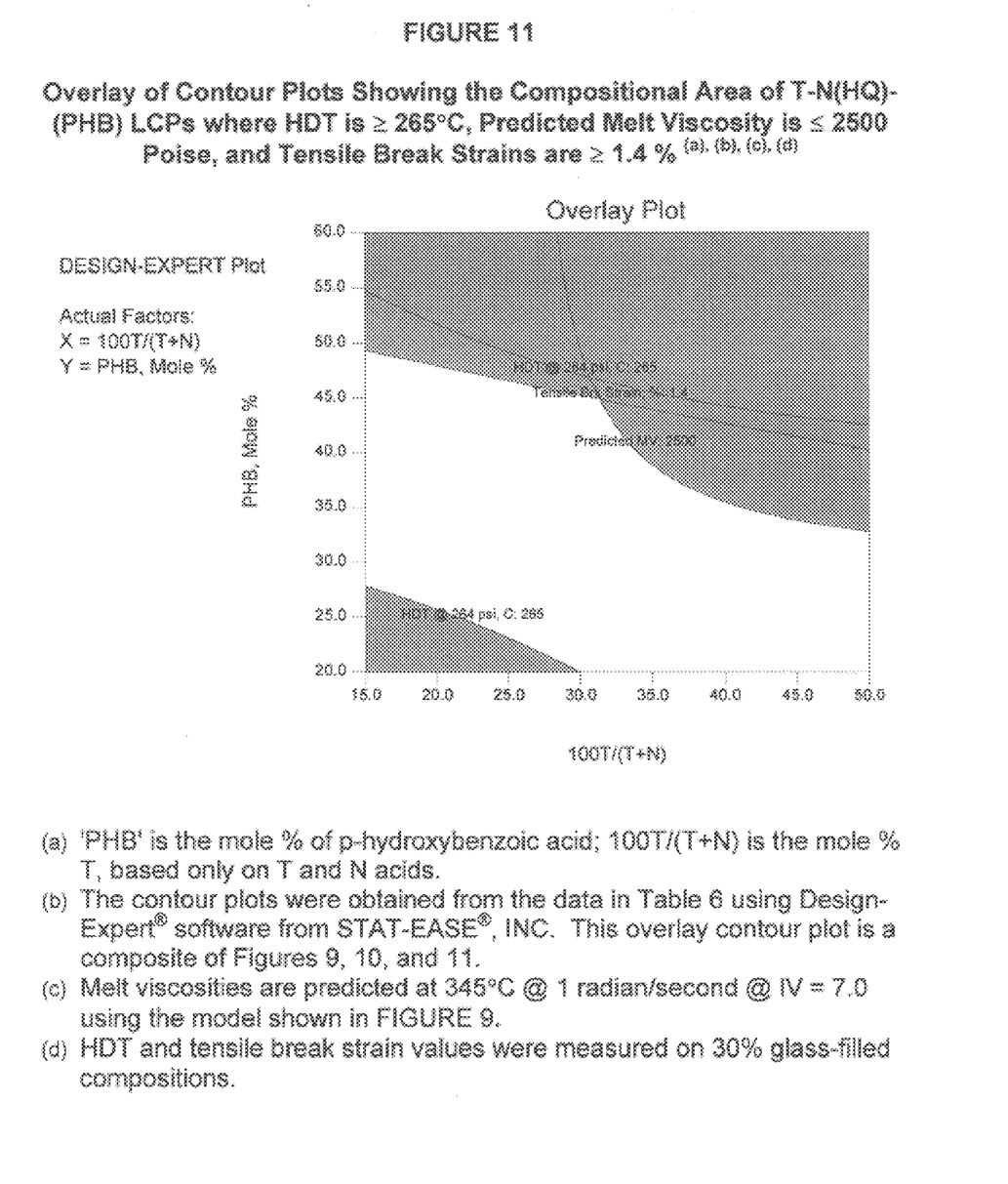
FIG. 11- Graphical representation of an overlay of contour plots demonstrating the compositional area of T-N (HQ)-(PHB) LCPs where HDT is $\geq 265°$ C., predicted melt viscosity is $\leq 2500$ poise, and tensile break strains are $\geq 1.4\%$.

FIG. 11 is an overlay of the contour plots from FIGS. 8, 9, and 10 that shows the compositional area claimed in this invention, i.e., LCP compositions that (1) have melting points by DSC ≦360° C., melt viscosities at 345° C./1 radian/second at IV=7.0≦2500 poise, HDT's ≧965° C. (264 psi.), and tensile break strains ≧1.4% and (2) that are derived from about 3.8 to about 20 mole % terephthalic acid (T), from about 15 to about 31 mole % 2,6-naphthalenedicarboxylic acid (N), about 25 to about 40 mole % hydroquinone (HQ), and from about 20 to about 51 mole % p-hydroxybenzoic acid (PHB), where the T:N molar ratio may vary from about 15:85 to about 50:50, the moles of HQ are equal to the sum of the moles of T+N, and the molar sum of all monomer moieties is equal to 100 mole %.

This invention can be further illustrated by the following examples of preferred embodiments thereof, although it will be understood that these examples are included merely for purposes of illustration and are not intended to limit the scope of the invention unless otherwise specifically indicated.

EXAMPLES

In the examples, inherent viscosities (I. V.'s) of the LCPs are measured at 25° C. in 60/40 pentafluorophenol/1,2,4-trichlorobenzene at 0.1 g/100 ml in a Schott Gerate viscometer. The samples are dissolved by stirring at room temperature.

Melting points are determined using a Differential Scanning Calorimeter, Model 2920, using a Thermal Analyst 2200 control system with LNCA II accessory at a heating rate of 20° C./minute.

Unless otherwise noted herein, inherent viscosity (IV) is measured in dL/g units at 25° C. in 60:40 by weight pentafluorophenol/1,2,4-trichlorobenzene at 0.1 g/100 mL in a Schoft Gerate viscometer.

The composition of the liquid crystalline polyesters is determined by hydrolyzing about 100 mg of the polyester in a magnetically stirred culture tube in 2 ml of deoxygenated dimethyl sulfoxide—d6 and 0.5 ml of deoxygenated 5N NaOH in methanol—d4. The hydrolysis is carried out at 80° C. After the hydrolysis, the tube is cooled slightly and then 5 ml of deoxygenated D2O containing a reference is added to dissolve all the solids. The solution is then added to a NMR tube and capped. The proton NMR spectral data are collected with a JEOL Delta 270 Spectrometer operating at 270.05 MHz for observation of the proton nucleus.

The melt viscosity of the various samples of LCP I, LCP II, LCP III, LCP IV, LCP V, and LCP VI is determined with a Rheometrics Mechanical Spectrometer (RMS 800) with 25 mm parallel plates. Samples are vacuum dried at 100° C. overnight or longer before testing. Samples are initially melted and held at 365° C. for two minutes and then cooled to 345° C. under a nitrogen blanket. The dual heating sequence is necessary to obtain reproducible results with minimum degradation of the sample. The measurement of melt viscosity is begun 10 minutes after the sample is loaded into the spectrometer. All measurements are made with 10% strain at which the strain effect on the rheological properties is negligible.

Example 1

This example illustrates the well-known laboratory melt-polymerization procedure used to prepare an LCP having the composition, 13.3T–20.0N–33.3(HQ)–33.3(PHB), where 'T' is terephthalic acid, 'N' is 2,6-naphthalene dicarboxylic acid, 'HQ' is hydroquinone, and 'PHB' is p-hydroxybenzoic acid and the sum of the mole percentages of T, N, HQ, and PHB is equal to 100 mole %. This example illustrates the lab-scale preparation, specifically, of compositions 5, 6,and 7 of Table 1. (A very similar procedure is used to prepare the compositions of Tables 2 and Table 3.)

A 1000-mL, single-necked flask is equipped with a stainless steel stirrer, provisions for maintaining a nitrogen atmosphere and applying vacuum, and an outlet that is attached to a dry-ice trap to condense to volatile by-products of the polymerization. Into the flask are added the following:

72.00 g (0.40 mole) p-Acetoxybenzoic acid
26.56 g (0.16 mole) Terephthalic acid
51.84 g (0.24 mole) 2,6-Naphthalene dicarboxylic acid
97.68 g (0.44 mole) Hydroquinone diacetate The flask is evacuated and bled to nitrogen three times to displace the air and then is partially immersed in a metal bath maintained at 280° C. The flask is heated at 280° C. for 60 minutes, 300° C. for 45 minutes, and 360° C. for 30 minutes. (Stirring is begun as soon as the flask contents are sufficiently molten.) Vacuum is then applied to the flask during 20 minutes to 0.3 torr and continued for 40 minutes to obtain a high viscosity, opaque-tan product. The product has an IV of 6.30 and a DSC melting point of 322° C. (All of the other compositions of Table 1 are prepared by this method from the appropriate amounts of the same monomers.)

Example 2

This example illustrates a well-known, large-scale melt-polymerization procedure used to prepare the LCP compositions of Table 6.

An LCP batch is prepared by placing the materials listed below into a jacketed, stainless steel reactor (SYLTHERM heat transfer fluid is used) equipped with dual sigma-blade agitator, a reflux condenser, coolant water, pressurization capability, vacuum capability, a source of nitrogen gas, and an outlet through which the by-products of the polymerization are removed:

4.84 pounds Terephthalic acid,
10.28 pounds 2,6-Naphthalenedicarboxylic acid,
15.63 pounds Hydroquinone diacetate,
13.80 pounds p-Acetoxybenzoic acid The reactor is pressurized to 30 psig with nitrogen three times and depressurized to remove the air. The reactor is then pressurized to 25 psig with nitrogen and heated to 265° C. where it is stirred for 6 hours. (Stirring is started when the melt temperature reaches about 140° C. and is continued for the duration of the polymerization.) The reactor is then depressurized, heated to 320° C. for 30 minutes, to 330° C. for 30 minutes, to 340° C. for 30 minutes, and to 360° C. for 15 minutes. Vacuum is then applied at the rate of 13 mm of Hg/minute until a pressure of 0.5 torr is attained. After being heated under 0.5 torr @360° C. for 2.5 hours, the reactor is bled to nitrogen and the product is removed. The light tan, opaque polymer has an IV of 6.8 and is ground for compounding with glass fibers and injection molding. The polymer is compounded in a 30-mm, twin-screw Werner-Pfleiderer extruder with 30 weight % glass fiber (11 micron by 1/8 inch), extruded into about 1/8-inch rod, and pelletized. The compounded LCP/glass blend is then injection molded in a Boy 50 Injection Molding Machine into light-tan, 1/8-inch tensile and flexural bars that are tested according to standard ASTM test methods for tensile elongation at break (extensometer is used) and HDT. The data are shown as Example 2A in Table 6. Nine other LCP preps are carried out using the appropriate amounts of the same starting materials to obtain the LCPs of Examples 2B–2J shown in Table 6.

The invention has been described in detail with particular reference to preferred embodiments thereof, but it will be understood that variations and modifications can be effected within the spirit and scope of the invention.

TABLE 1

Effect of Composition on the Melting Point of T-N-(HQ)-(PHB) LCP's (Designed Experiment) (Lab Preps)[a],[b]

| Composition # | T, Mole % | N, Mole % | HQ, Mole % | PHB, Mole % | 100T/ (T + N)[c] | DSC Tm, ° C. |
|---|---|---|---|---|---|---|
| 1 | 13.846 | 9.231 | 23.077 | 53.846 | 60 | 371 |
| 2 | 20.000 | 13.333 | 33.333 | 33.333 | 60 | 357 |
| 3 | 24.706 | 16.471 | 41.176 | 17.647 | 60 | 365 |
| 4 | 9.231 | 13.846 | 23.077 | 53.846 | 40 | 329 |
| 5 | 13.333 | 20.000 | 33.333 | 33.333 | 40 | 321 |
| 6 | 13.333 | 20.000 | 33.333 | 33.333 | 40 | 323 |
| 7 | 13.333 | 20.000 | 33.333 | 33.333 | 40 | 326 |
| 8 | 16.471 | 24.706 | 41.176 | 17.647 | 40 | 328 |
| 9 | 4.615 | 18.462 | 23.077 | 53.846 | 20 | 325 |
| 10 | 6.667 | 26.667 | 33.333 | 33.333 | 20 | 337 |
| 11 | 8.235 | 32.941 | 41.176 | 17.647 | 20 | 375 |

TABLE 1-continued

Effect of Composition on the Melting Point of T-N-(HQ)-(PHB) LCP's (Designed Experiment) (Lab Preps)[a],[b]

| Composition # | T, Mole % | N, Mole % | HQ, Mole % | PHB, Mole % | 100T/ (T + N)[c] | DSC Tm, ° C. |
|---|---|---|---|---|---|---|
| 12 | 8.571 | 20.000 | 28.571 | 42.857 | 30 | 320 |
| 13 | 8.571 | 20.000 | 28.571 | 42.857 | 30 | 325 |
| 14 | 20.732 | 18.293 | 39.024 | 21.951 | 53.125 | 339 |

[a]'T' is terephthalic acid; 'N' is 2,6-naphthalene dicarboxylic acid; 'HQ' is hydroquinone; and 'PHB' is p-hydroxybenzoic acid. These LCPs were prepared by a well-known melt polymerization procedure from terephthalic acid, 2,6-naphthalene dicarboxylic acid, hydroquinone diacetate, and p-acetoxybenzoic acid. In this table, the sum of the mole percentages of T, N, HQ, and PHB is equal to 100 mole %.

[b]See Example 1 for a typical lab prep of these compositions.

[c]100T/(T + N) was obtained by dividing the value for mole % T by the sum of the mole % T value and the mole % N value and multiplying by 100.

TABLE 2

IV/MELT VISCOSITY DATA FOR LCP I, LCP II, AND LCP III

| LCP I[a] | | LCP II[b] | | LCP III[c] | |
|---|---|---|---|---|---|
| | Melt Viscosity, Poise, @ 345° C./1 | | Melt Viscosity, Poise, @ 345° C./1 | | Melt Viscosity, Poise, @ 345° C./1 |
| IV | Radian/Sec. | IV | Radian/Sec. | IV | Radian/Sec. |
| 4.40 | 445 | 4.36 | 185 | 3.99 | 91 |
| 5.13 | 658 | 4.81 | 326 | 5.34 | 194 |
| 6.04 | 1,666 | 5.60 | 650 | 6.13 | 400 |
| 7.12 | 4,172 | 6.78 | 2,522 | 7.62 | 2,083 |
| 10.63 | 117,600 | 7.08 | 1,842 | 7.81 | 3,009 |
| | | 7.43 | 3,135 | 8.06 | 3,809 |
| | | 7.59 | 5,365 | | |

"a"—LCP I is 14.3% T—14.3% N—28.6% (HQ)—42.8% (PHB),
"b"—LCP II is 8.6% T—20% N—28.6% (HQ)—42.8% (PHB),
"c"—LCP III is 15.8% T—23.6% N—39.4% (HQ)—21.2% (PHB), where "T" is terephthalic acid; "N" is 2,6-naphthalenedicarboxylic acid; "HQ" is hydroquinone; and "PHB" is p-hydroxybenzoic acid.
See FIG. 1 for the plots and modelled curves of these data.

TABLE 3

IV/MELT VISCOSITY DATA FOR LCP IV, LCP V, AND LCP VI

| LCP IV[a] | | LCP V[b] | | LCP VI[c] | |
|---|---|---|---|---|---|
| | Melt Viscosity, Poise, @ 345° C./1 | | Melt Viscosity, Poise, @ 345° C./1 | | Melt Viscosity, Poise, @ 345° C./1 |
| IV | Radian/Sec. | IV | Radian/Sec. | IV | Radian/Sec. |
| 4.87 | 404 | 5.16 | 612 | 4.90 | 579 |
| 5.76 | 597 | 6.96 | 2,662 | 7.29 | 2,401 |
| 8.07 | 4,463 | 7.76 | 3,394 | 7.88 | 7,958 |
| 9.72 | 26,440 | 8.21 | 8,509 | 10.59 | 60,420 |

[a]LCP IV is 9.5% T—22.5% N—32% (HQ)—36% (PHB),
[b]LCP V is 7.5% T—17.3% N—24.8% (HQ)—50.4% (PHB),
[c]LCP VI is 11.5% T—17.1% N—28.6% (HQ)—42.8% (PHB), where "T" is terephthalic acid; "N" is 2,6-naphthalic acid; "HQ" is hydroquinone; and "PHB" is p-hydroxybenzoic acid.
[d]See FIG. 2 for the plots and modeled curves of these data.

TABLE 4

Melt Viscosity vs IV (Exponential Model Equations for Various LCP's)

| LCP | Composition (Mole %) | Exponential Model Equation (Best Fit)[a] |
|---|---|---|
| LCP I | 14.3T—14.3N—28.6(HQ)—42.8(PHB) | Melt Viscosity = $6.8515e^{0.9122(IV)}$, $R^2 = 0.9975$ |
| LCP II | 8.6T—20N—28.6(HQ)—42.8(PHB) | Melt Viscosity = $3.1721e^{0.9483(IV)}$, $R^2 = 0.9712$ |
| LCP III | 15.8T—23.6N—39.4(HQ)—21.2(PHB) | Melt Viscosity = $1.5083e^{0.9551(IV)}$, $R^2 = 0.9712$ |
| LCP IV | 9.5T—22.5N—32(HQ)—36(PHB) | Melt Viscosity = $4.6661e^{0.8733(IV)}$, $R^2 = 0.9882$ |
| LCP V | 7.5T—17.3N—24.8(HQ)—50.4(PHB) | Melt Viscosity = $10.074e^{0.7918(IV)}$, $R^2 = 0.9532$ |
| LCP VI | 11.5T—17.1N—28.6(HQ)—42.8(PHB) | Melt Viscosity = $8.6822e^{0.8314(IV)}$, $R^2 = 0.9757$ |

[a]These model equations were determined by plotting the data given in TABLES 2 and 3 as shown in FIGS. 1 and 2 using Microsoft EXCEL software.

TABLE 5

Estimated Melt Viscosities @ 345° C./1 Radian/Sec. & IV = 7.0
For Various LCP's (Exponential Model)[a]

| LCP | Composition (Mole %) | Melt Viscosity Poise[b] |
|---|---|---|
| LCP I | 14.3T—14.3N—28.6(HQ)—42.8(PHB) | 4153 |
| LCP II | 8.6T—20N—28.6(HQ)—42.8(PHB) | 2422 |
| LCP III | 15.8T—23.6N—39.4(HQ)—21.2(PHB) | 1208 |
| LCP IV | 9.5T—22.5N—32(HQ)—36(PHB) | 2108 |
| LCP V | 7.5T—17.3N—24.8(HQ)—50.4(PHB) | 2572 |
| LCP VI | 11.5T—17.1N—28.6(HQ)—42.8(PHB) | 2925 |

[a]See FIGS. 1 and 2 and TABLE 4 for plots and model equations. The data in Tables 2 and 3 were plotted and the 'best-fit' equations were determined using Microsoft EXCEL ® software.
[b]Melt viscosities at IV = 7.0 and 345° C./1 radian/second were determined using the model equations shown in TABLE 4 by setting the IV = 7.0 and calculating the melt viscosity.

TABLE 6

Effect of Composition on the Melting Point, Melt Viscosity, HDT, and Tensile Break Strain of T—N—(HQ)—(PHB) LCP's (Designed Experiment)[a]

| Example # | Mole % T | Mole % N | Mole % PHB | Mole % HQ | 100T/(T + N)[e] | Tm, ° C. (DSC) | Tensile Break Strain, %[b] | HDT, ° C. @ 264 Psi[c] | Predicted Melt Visc @ IV = 7.0, Poise[d] |
|---|---|---|---|---|---|---|---|---|---|
| 2A | 12.7 | 20.7 | 33.3 | 33.3 | 38.0 | 331 | 1.9 | 288 | 2252 |
| 2B | 9.2 | 19.9 | 41.8 | 29.1 | 31.7 | 323 | 1.5 | 277 | 2416 |
| 2C | 5.1 | 22.5 | 44.9 | 27.5 | 18.4 | 325 | 1.6 | 276 | 1225 |
| 2D | 10.8 | 25.5 | 27.4 | 36.3 | 29.8 | 327 | 2.0 | 280 | 1863 |
| 2E | 16.3 | 23.5 | 20.5 | 39.8 | 40.9 | 326 | 1.9 | 288 | 1094 |
| 2F | 18.0 | 15.3 | 33.3 | 33.3 | 54.0 | 330 | | | 2689 |
| 2G | 4.5 | 19.7 | 51.5 | 24.2 | 18.8 | 315 | 1.2 | 268 | 991 |
| 2H | 4.3 | 23.7 | 43.9 | 28.1 | 15.4 | 329 | 1.7 | 286 | 989 |
| 2I | 4.5 | 19.7 | 51.5 | 24.2 | 18.8 | 339 | | | 991 |
| 2J | 16.3 | 23.5 | 20.5 | 39.8 | 40.9 | 321 | 1.8 | 285 | 1094 |

[a]T is terephthalic acid; 'N' is 2,6-naphthalene dicarboxylic acid, 'HQ' is hydroquinone; and 'PHB' is p-hydroxybenzoic acid. The molar sum of T, N, HQ, and PHB is 100%.
[b]These compositions were prepared in about 25 to 30-lb batches as described in Example 2.
[c]The tensile break strain (elongation) data were determined using an extensiometer according to ASTM D638.
[d]HDT (heat distortion temperature) was determined according to ASTM D648.
[e]The melt viscosity values at IV = 7.0 were predicted using the data from Table 5 and the following model developed using JMP ® software from SAS Institute, Inc.:

$$\text{MeltViscosity(Poise)} = 6417.88 - 178.32\left[\frac{100T}{(T + N)}\right] - 156.11[PHB] + 6.17\left\{\left[\frac{100T}{(T + N)}\right][PHB]\right\}$$

100T/(T + N) is obtained by dividing the % T value by the sum of the % T and % N values and multiplying by 100.

We claim:

1. A liquid crystalline polyester derived from:

(1) diacid residues consisting essentially of:

(a) about 3.8 to 20 mole percent terephthalic acid (T) residues, and (b) about 15 to 31 mole percent 2,6-naphthalenedicarboxylic acid(N);

(2) diol residues consisting essentially of:

(c) about 25 to 40 mole percent hydroquinone (HQ) residues; and (d) about 20 to 51 mole percent p-hydroxybenzoic acid (PHB) residues, wherein the T/T+N molar ratio is from about 15:85 and 50:50, the moles of HQ are equal to the sum of the moles of T+N, and the total of the (a), (b), (c), and (d) mole percentages is equal to 100, and the liquid crystalline polyester has a melting point determined by differential scanning calorimetry equal to or less than 360° C.

2. A liquid crystalline polyester according to claim 1 derived from:

(1) diacid residues consisting essentially of:

(a) about 6.9 to 20 mole percent terephthalic acid (T) residues, and (b) about 15 to 30 mole percent 2,6-naphthalenedicarboxylic acid(N);

(2) diol residues consisting essentially of:
 (c) about 27.5 to 40 mole percent hydroquinone (HQ) residues; and
 (d) about 20 to 45 mole percent p-hydroxybenzoic acid (PHB) residues, and
 wherein the moles of HQ are equal to the sum of the moles of T+N, and the total of the (a), (b), (c), and (d) mole percentages is equal to 100, and
 the liquid crystalline polyester has a melting point determined by differential scanning calorimetry equal to or less than 360° C.

3. A liquid crystalline polyester according to claim 2 derived from:
 (1) diacid residues consisting essentially of:
  (a) about 9 to 16 mole percent terephthalic acid (T) residues, and
  (b) about 18 to 28 mole percent 2,6-naphthalenedicarboxylic acid(N);
 (2) diol residues consisting essentially of:
  (c) about 30 to 40 mole percent hydroquinone (HQ) residues; and
  (d) about 20 to 40 mole percent p-hydroxybenzoic acid (PHB) residues, and
  wherein, the moles of HQ are equal to the sum of the moles of T+N, and the total of the (a), (b), (c), and (d) mole percentages is equal to 100, and
  the liquid crystalline polyester has a melting point determined by differential scanning calorimetry equal to or less than 360° C.

4. A liquid crystalline polyester according to claim 1 having an inherent viscosity of about 3.0 to 11.0 dL/g measured at 25° C. in 60:40 by weight pentafluorophenol/1,2,4-trichlorobenzene at 0.1 g/100 mL in a Schoft Gerate viscometer.

5. A liquid crystalline polyester according to claim 4 having an inherent viscosity of about 5.0 to 10.0 dL/g measured at 25° C. in 60:40 by weight pentafluorophenol/1,2,4-trichlorobenzene at 0.1 g/100 mL in a Schoft Gerate viscometer.

6. A liquid crystalline polyester according to claim 1 wherein said polyester has a tensile elongation at break of ≧1.8%.

7. A liquid crystalline polyester according to claim 1 wherein said polyester has a melt viscosity at 345° C. and 1 radian/second of ≦2500 poise at an inherent viscosity equaling from about 3.0 to 11.0 dL/g.

8. A liquid crystalline polyester according to claim 1 wherein said polyester has a heat distortion temperature at 264 psi of about ≧265° C.

9. A liquid crystalline polyester according to claim 1 wherein said polyester has a tensile elongation at break of about ≧1.8%, a melt viscosity at 345° C. and 1 radian/second of ≦2500 poise at an inherent viscosity equaling 3.0 to 11.0 dL/g, and a heat distortion temperature at 264 psi of ≧265° C.

10. A liquid crystalline polyester according to claim 9 wherein said polyester has a tensile elongation at break of ≧1.4%, a melt viscosity at 345° C. and 1 radian/second of ≦2500 poise at an inherent viscosity equaling 5.0 to 10.0 dL/g, and a heat distortion temperature at 264 psi of ≧265° C.

11. A liquid crystalline polyester according to claim 1 prepared using a catalyst selected from the group consisting of dialkyl metal oxide, diaryl metal oxide, titanium dioxide, alkoxy titanium silicates, titanium alkoxides, alkali metal and alkaline earth metal salts of carboxylic acids, gaseous acid catalysts and hydrogen halides.

12. A liquid crystalline polyester composition of claim 11 wherein said catalyst is utilized in the amount of about 50 to about 500 parts per million based on the total weight of starting materials.

13. A liquid crystalline polyester of claim 12 wherein said catalyst is utilized in the amount of 100 to about 300 parts per million based on the total weight of the starting materials.

14. A liquid crystalline polyester of claim 1 further comprising additives and/or fillers.

15. A liquid crystalline polyester of claim 14 wherein said additives and/or fillers are in fibrous, particulate, or flaky form.

16. A liquid crystalline polyester of claim 15 wherein said additives and/or fillers comprise antioxidants, titanium dioxide, carbon black, clay, flame retardants, drip suppressants and other pigments.

17. A liquid crystalline polyester of claim 15 wherein said fibrous fillers are selected from glass fiber, carbon fiber, silica fiber, silica/alumina fiber, alumina fiber, zirconia fiber, boron nitride fiber, silicon nitride fiber, boron fiber, potassium titanate fiber, and fibrous materials of stainless steel, aluminum, titanium, copper, and brass.

18. A liquid crystalline polyester of claim 15 wherein said particulate fillers are selected from carbon black, graphite, silica, quartz powder, glass beads, milled glass fiber, glass balloons, glass powder, calcium silicate, aluminate silicate, kaolin, talc, clay, diatomaceous earth, wollastonite, iron oxide, titanium oxide, zinc oxide, antimony trioxide, and alumina, calcium carbonate, magnesium carbonate, calcium sulfate, barium sulfate, ferrite, silicon carbide, silicon nitride and boron nitride.

19. A liquid crystalline polyester of claim 15 wherein said flaky fillers or additives are selected from mica, glass flake, and metallic foils.

20. A liquid crystalline polyester of claim 14 wherein said fillers include organic fillers selected from organic polyester fiber, liquid crystal polymer fiber, aromatic polyamide fiber and polyimide fiber.

21. A liquid crystalline polyester of claim 14 wherein said fillers may be used in a total amount of up to 60 weight percent based on the total weight of said fillers and said polyester.

22. A molding composition comprising a blend of:
 (1) a liquid crystalline polyester as defined in claim 1; and
 (2) at least 20 weight percent glass fibers based on the total weight of the molding composition.

23. A molding composition according to claim 17 wherein said glass fibers are present in the amount of about 30 weight percent based on the total weight of the molding composition.

24. A molding composition according to claim 1 wherein the liquid crystalline polyester has an inherent viscosity of about 3.0 to 11.0 dL/g measured at 25° C. in 60:40 by weight pentafluorophenol/1,2,4-trichlorobenzene at 0.1 g/100 mL in a Schott Gerate viscometer and the molding composition contains about 25 to 40 weight percent glass fibers based on the total weight of the molding composition.

25. A molding composition according to claim 24 wherein the liquid crystalline polyester has an inherent viscosity of about 5.0 to 10.0 dL/g measured at 25° C. in 60:40 by weight pentafluorophenol/1,2,4-trichlorobenzene at 0.1 g/100 mL in a Schott Gerate viscometer and the molding composition contains about 25 to 45 weight percent glass fibers based on the total weight of the molding composition.

26. A molding composition according to claim 17 wherein the glass fiber has a thickness of about 9 to 15 microns and a length of about 0.8 to 26 mm.

27. A molded article having a thickness of less than about 1.5 mm comprising the molding composition of claim 22.

* * * * *